(12) United States Patent
Ebihara et al.

(10) Patent No.: US 6,852,573 B2
(45) Date of Patent: Feb. 8, 2005

(54) HEAT SINK SHEET AND FABRICATION METHOD THEREFOR

(75) Inventors: Fumitaka Ebihara, Kawaguchi (JP); Masao Tatsuzawa, Oura-Gun (JP); Masahiko Takahashi, Oura-Gun (JP)

(73) Assignee: Mochida Corporation, Tokyo (JP)

(*) Notice: Subject to any disclaimer, the term of this patent is extended or adjusted under 35 U.S.C. 154(b) by 0 days.

(21) Appl. No.: 09/876,733

(22) Filed: Jun. 7, 2001

(65) Prior Publication Data
US 2002/0011660 A1 Jan. 31, 2002

(30) Foreign Application Priority Data
Jun. 7, 2000 (JP) ........................... 2000-170156

(51) Int. Cl.⁷ ............................................. H01L 21/00
(52) U.S. Cl. ....................................................... 438/122
(58) Field of Search ..................... 428/40.1; 257/625, 257/675, 796; 438/122

(56) References Cited

U.S. PATENT DOCUMENTS

| | | | | |
|---|---|---|---|---|
| 4,574,879 A | * | 3/1986 | DeGree et al. | 165/185 |
| 5,831,374 A | * | 11/1998 | Morita et al. | 313/46 |
| 6,165,612 A | * | 12/2000 | Misra | 428/344 |
| 6,201,055 B1 | * | 3/2001 | Lutz et al. | 524/493 |
| 6,228,965 B1 | * | 5/2001 | Muta et al. | 526/328.5 |
| 6,432,497 B2 | * | 8/2002 | Bunyan | 428/40.1 |
| 2001/0004131 A1 | * | 6/2001 | Masayuki et al. | 257/720 |

FOREIGN PATENT DOCUMENTS

| | | | |
|---|---|---|---|
| JP | 57-158731 | 3/1980 | |
| JP | 61-085431 | 6/1986 | |
| JP | 06-264037 | 9/1994 | |
| JP | 11-251772 | * 9/1999 | H05K/7/20 |

OTHER PUBLICATIONS

Bosworth et al., Exceptional Performance from the Development, Qualification and Implementation of a Silicone Adhesive for Bonding Heatsinks to Semiconductor Packages, IEEE Transactions on components, packaging and Manufacturing Technology, Part A, vol. 18, No. 1, Mar. 1995 pp. 94–100.*

*The Adhesion Society of Japan*, Adhesion Handbook (Third Edition), Nikkankogyoshinbunsya, First Impression of the Third Edition, pp 609–611, 677–683 (Jun. 28, 1996).

* cited by examiner

*Primary Examiner*—W. David Coleman
(74) *Attorney, Agent, or Firm*—Ladas & Parry LLP

(57) ABSTRACT

There is provided a heat sink sheet which can secure a heat source and a heat sink such as an aluminum cooling fin to each other and is superior in heat sink performance. The heat sink sheet is achieved by adhering a pressure sensitive adhesive layer adhered to the whole or part of a surface of a silicone heat sink layer. It is desirable that the pressure sensitive adhesion layer be made of an acrylic-containing adhesive or an urethane-containing adhesive, and a heat sink filler is advantageously blended with the pressure sensitive adhesive layer.

3 Claims, 6 Drawing Sheets

HEAT SINK SHEET AND FABRICATION METHOD THEREFOR

BACKGROUND OF THE INVENTION

1. Field of the Invention

The present invention relates to the manufacture of films or sheets containing a polymeric substance, and more particularly, to a heat sink sheet which efficiently dissipates heat by being interposed between a heat sink such as an aluminum cooling fin and a heat source of electronic equipment such as a power transistor, a high-density integrated circuit and a plasma display panel (PDP) in such a manner as to fill the gap between the heat sink and the heat source.

2. Description of the Related Art

In recent years, electronic equipment has become higher and higher in performance and smaller and smaller in size, so that electronic parts such as semiconductors are becoming higher in density and function. As the density and function of the electronic equipment become higher, the electronic parts themselves generate a larger amount of heat. If no measures are taken against such heat, the electronic parts are degraded in quality and damaged. It is, therefore, necessary and indispensable to use an apparatus or a mechanism for efficiently removing heat generated from the electronic parts.

The existing method for removing heat generated from a heat source in electronic equipment is to interpose a heat sink material between an aluminum cooling fin and a heat source of electronic equipment. The heat sink material used in this method is a silicone heat sink grease, a silicone heat sink sheet, an acrylic-containing pressure sensitive adhesive sheet, an urethane-containing pressure sensitive adhesive sheet or the like. These heat sink materials are of the type in which a filler of high heat conductivity is blended with a soft polymeric material.

However, the above-described conventional heat sink material using a silicone heat sink grease, a silicone heat sink sheet or the like is superior in heat sink performance because the heat sink material is charged with a heat sink filler of high heat conductivity in a large amount. However, the heat sink material has no function of a pressure sensitive adhesive, and has the problem that the aluminum cooling fin and the heat source must be secured by using separate means such as screws. In addition, there is another problem that the silicone heat sink sheet is difficult to secure to a heat source such as a CPU, an aluminum cooling fin or the like during the process of manufacturing electronic equipment.

On the other hand, the acrylic-containing pressure sensitive adhesive sheet and the urethane-containing pressure sensitive sheet are superior in securing performance to the silicone heat sink grease or the silicone heat sink sheet. However, the acrylic- and urethane-containing pressure sensitive sheets are remarkably low in heat conductivity compared to the silicone-containing heat sink material and has the problem that they cannot fully conduct heat to aluminum cooling fins and cannot be used in portions which generate a large amount of heat.

SUMMARY OF THE INVENTION

The present invention has been made in view of the above-described problems, and provides a heat sink sheet which can secure a heat source and a heat sink such as an aluminum cooling fin to each other and is superior in heat sink performance, and a fabrication method for such a heat sink sheet, as well as a plasma display panel using such a heat sink sheet.

The present invention relates to a heat sink sheet which has the performance of a pressure sensitive adhesive and efficiently dissipates heat by being interposed between a heat sink such as an aluminum cooling fin and a heat source of electronic equipment in such a manner as to fill the gap between the heat sink and the heat source. In accordance with one aspect of the present invention, the above-described object of the present Invention is achieved by adhering a pressure sensitive adhesive layer adhered to the whole or part of a surface of a silicone heat sink layer. It is desirable that the pressure sensitive adhesive layer is made of an acrylic-containing adhesive or an urethane-containing adhesive, and a heat sink filler is advantageously blended with the pressure sensitive adhesive layer. Moreover, in the heat sink sheet having any of these constructions, a primer for adhesion to silicone may be applied to the pressure sensitive adhesive layer so that the pressure sensitive adhesive layer and the silicone heat sink layer are adhered to each other, or an adhesion imparting agent may be applied to the silicone heat sink layer so that the pressure sensitive adhesive layer and the silicone heat sink layer are directly adhered to each other.

In accordance with another aspect of the present invention, the above-described object of the present invention is achieved by interposing liquid heat sink silicone between at least two separator sheets each having a releasing-agent-treated surface on which a pressure sensitive adhesive is formed, and applying heat to adhere the liquid heat sink silicone to a pressure sensitive adhesive layer by bridge bonding, thereby forming a sheet. Otherwise, the above-described object of the present invention is achieved by forming a pressure sensitive adhesive on a releasing-agent-treated sheet surface, coating the pressure sensitive adhesive layer surface with heat sink silicone, and applying heat to adhere the heat sink silicone to the pressure sensitive adhesive layer surface by bridge bonding.

In addition, it is possible to fabricate a plasma display device wherein a heat sink sheet according to the present invention is interposed in an intimately adhered state between a plasma display panel and a heat sink plate, and the plasma display panel and the heat sink plate are secured by the pressure sensitive adhesive layer of the heat sink sheet.

BRIEF DESCRIPTION OF THE DRAWINGS

The present invention will become more readily appreciated and understood from the following detailed description of a preferred embodiment of the present invention when taken in conjunction with the accompanying drawings, in which.

DETAILED DESCRIPTION OF THE PREFERRED EMBODIMENTS

An embodiment of the present invention will be described below in detail with reference to the accompanying drawings.

Figure 1:
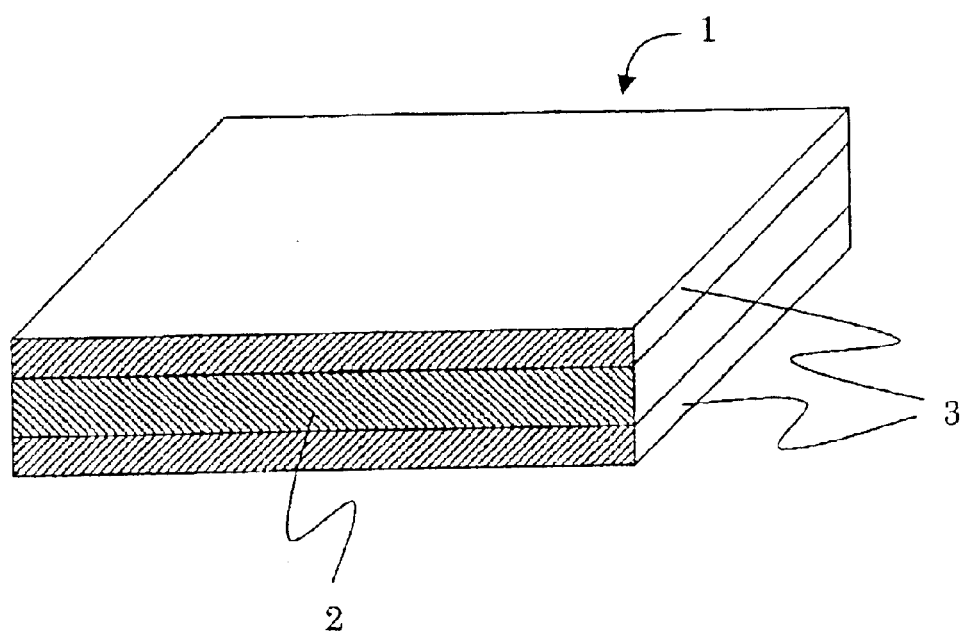
FIG. 1 is a schematic cross-sectional view showing the structure of a heat sink sheet according to the present invention.

FIG. 1 is a schematic cross-sectional view showing the structure of a heat sink sheet 1 according to the present invention. As shown in FIG. 1, the heat sink sheet 1 is made of a silicone heat sink layer 2 and pressure sensitive adhesion layers 3. The pressure sensitive adhesion layers 3 mainly serves the role of securing the heat sink sheet 1 according to the present invention between a heat source such as electronic equipment and a heat sink such as an aluminum cooling fin. The heat sink layer 2 serves the role of efficiently conducting heat from the heat source such as electronic equipment to the heat sink. For this reason, each of the pressure sensitive adhesive layers 3 is adhered to the whole or part of a different one of the surfaces of the heat sink layer 2.

The heat sink layer 2 used in the present invention is a layer in which silicone rubber or silicone gel which is a soft polymeric material is filled with a substance of high heat conductivity as a filler, which is a powder such as alumina, zinc oxide, aluminum hydroxide, silicon carbide, magnesia or boron nitride. Regarding the number of weight parts of the filler to be blended, it is desirable that 200 or more weight parts of the filler is blended with 100 weight parts of silicone.

Each of the pressure sensitive adhesive layers 3 is made of a layer in which an acrylic-containing pressure sensitive adhesive or an urethane-containing pressure sensitive adhesive is filled with a substance of high heat conductivity as a filler, which is a powder such as alumina, zinc oxide, aluminum hydroxide, silicon carbide, magnesia or boron nitride. Such filler of high heat conductivity corresponds to a heat sink filler set forth in the appended claims. The amount of the filler to be blended with each of the pressure sensitive adhesive layers needs to be selected within the range in which the filler does not degrade the adhesion performance of the pressure sensitive adhesive, and it is desirable that 300 or less weight parts of the filler may be blended with 100 weight parts of the pressure sensitive adhesive.

A method of integrating the silicone heat sink layer with the acrylic-containing pressure sensitive adhesive layer or the urethane-containing pressure sensitive adhesive layer is to prepare a conventional base material such as a film or a woven fabric or an nonwoven fabric, form an acrylic-containing pressure sensitive adhesive and a silicone-containing pressure sensitive adhesive on the opposite surfaces of the base material, respectively, and stick a silicone heat sink layer to the pressure sensitive adhesive surface. However, this method is not desirable, because the introduction of the base material offers problems such as a reduction in heat conductivity, a shortage of softness, an increase in cost due to an increase in the complexity of a working process. To cope with this problem, the present invention makes it possible to integrate a silicone heat sink layer and a pressure sensitive adhesive layer by a method of adding an adhesion imparting agent to the silicone heat sink layer or by a method of applying a primer for adhesion to silicone to the pressure sensitive adhesive layer and directly adhering the silicone heat sink layer to the pressure sensitive adhesive layer. The adhesion imparting agent to be added to silicone may use various kinds of silane coupling agents or KE 1800 C (trade name, manufactured by Shin-Etsu Chemical Co., Ltd.), and the primer may use ME 151 (trade name, manufactured by GE Toshiba Silicones) or a silane coupling agent which is diluted with a solvent.

The pressure sensitive adhesive layer formed on the surface of the silicone heat sink layer by such method provides a heat sink sheet which is soft and has the performance of a pressure sensitive adhesive as well as excellent heat conductivity. The heat conductivity of the entire heat sink sheet according to the present invention is slightly lower than the heat conductivity of the internal silicone heat sink layer. This is because the heat conductivity of the pressure sensitive adhesive layer with which the filler is not blended is low, and to restrain a reduction in the heat conductivity, it is desirable to reduce the thickness of the pressure-sensitive adhesive layer and blend the filler with the pressure sensitive adhesive layer in an allowable amount. Specifically, it is desirable to form the pressure sensitive adhesive layer and the silicone heat sink layer so that the thickness of the pressure sensitive adhesive layer can be made 30% or less of the thickness of the silicone heat sink layer.

Incidentally, it is possible to use any kind of pressure sensitive adhesive that has adhesion characteristics and can be improved in heat conductivity by the addition of a filler, and the present invention is not to be construed as limited to only the above-described acrylic-containing pressure sensitive adhesive or urethane-containing pressure sensitive adhesive.

Figure 2:
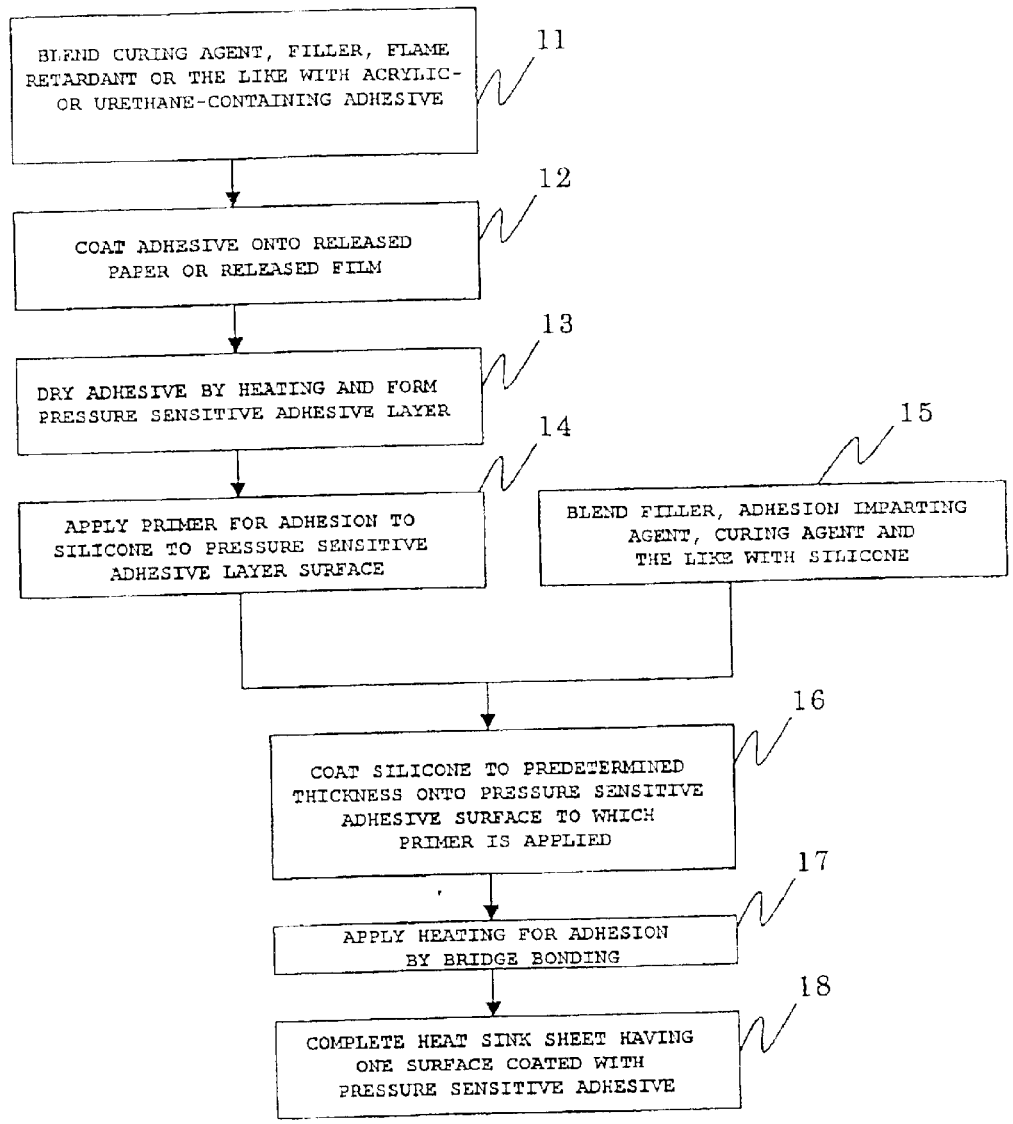
FIG. 2 is a block diagram showing the steps of a method of manufacturing a heat sink sheet having a pressure sensitive adhesive formed on its one surface.

A method of manufacturing the heat sink sheet according to the present invention will be described below. FIG. 2 is a block diagram showing the steps of a method of manufacturing a heat sink sheet having a pressure sensitive adhesive formed on its one surface.

A curing agent and a filler and, if necessary, a flame retardant or the like are blended with an acrylic- or urethane-containing pressure sensitive adhesive (11), and the adhesive is coated onto released paper or released film to a predetermined thickness by a doctor coating machine or the like (12). The adhesive coating is dried by heating, whereby a pressure sensitive adhesive layer is formed on the released paper or the released film (separator) (13). A primer for adhesion to silicone is applied to the surface of the pressure sensitive adhesive layer by using a brush or a roll coater as required. However, if an adhesion imparting agent is blended with silicone, this step is not necessary Independently of the above-described steps, a filler, an adhesion imparting agent, a curing agent and the like are blended with silicone (15). This blended silicone is coated onto the primer applied to the pressure sensitive adhesive layer, to a predetermined thickness (16). The pressure sensitive adhesive layer coated with silicone is heated to adhere the pressure sensitive adhesive agent to silicone by bridge bonding (17), thereby forming a heat sink sheet having a pressure sensitive adhesive on one surface (18).

Figure 3:
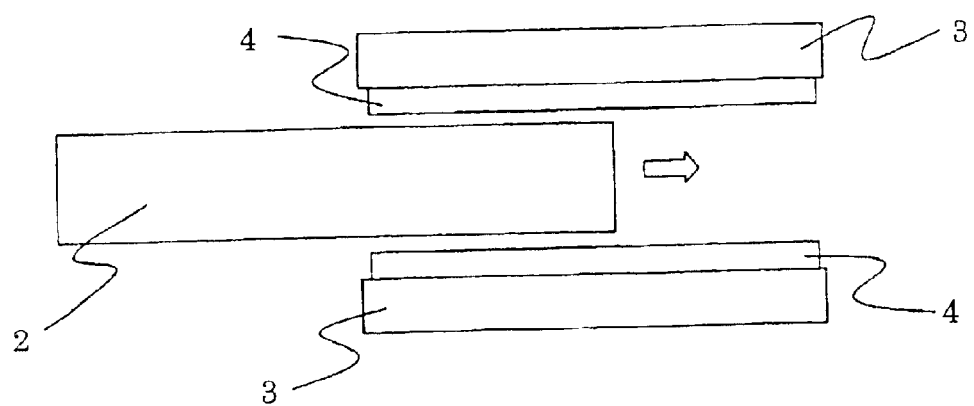
FIG. 3 is a block diagram showing the steps of a method of manufacturing a heat sink sheet having pressure sensitive adhesive layers on its opposite surfaces.

FIG. 3 is a schematic view showing a method of forming pressure sensitive adhesive layers on the opposite surfaces of a silicone heat sink layer. If pressure sensitive adhesive layers are to be formed on the opposite surfaces of a silicone heat sink layer, in the above-described process of manufacturing a heat sink sheet having a pressure sensitive adhesive on one surface, the primer for adhesion to silicone has been applied to the surface of the pressure sensitive adhesive layer (14), thereby preparing two pressure sensitive adhesive layers 3 each having a surface coated with a primer 4. Then, as shown in FIG. 3, the two pressure sensitive adhesive layers 3 are arranged in such a manner that the surfaces each coated with the primer 4 are opposed to each other, and silicone blended with which a filler and the like is charged into and spread in the gap between the opposed surfaces, thereby bringing the two pressure sensitive adhesion layers 3 into intimate contact with silicone. Subsequently, the pressure sensitive adhesive layers 3 are heated to obtain the heat sink sheet 1 in which the pressure sensitive adhesion layers 3 are integrally formed on the top and bottom surfaces of the heat sink silicone layer 2.

Figure 4:
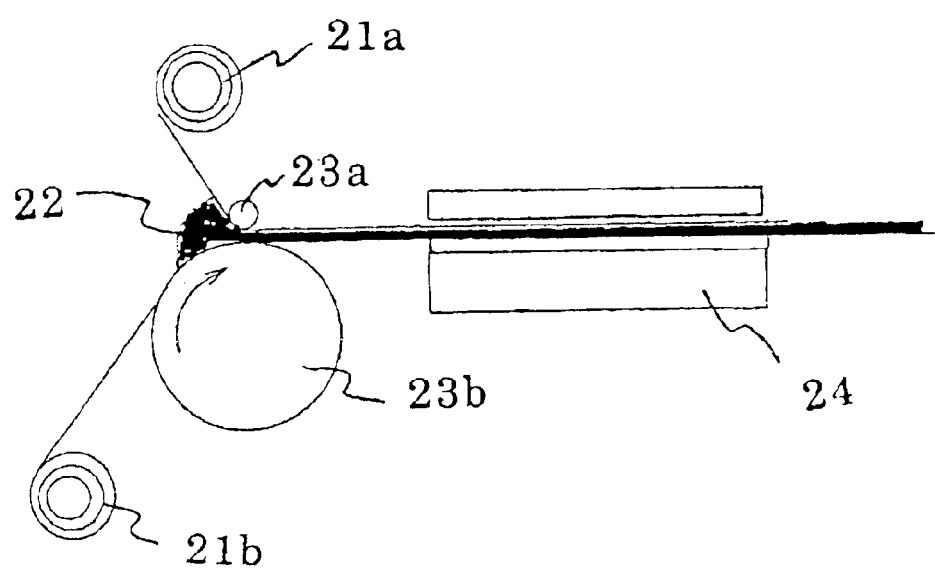
FIG. 4 is a schematic view showing one example of an apparatus for manufacturing a heat sink sheet according to the present invention.

FIG. 4 is a schematic view showing one example of an apparatus for forming the above-described type of heat sink sheet having pressure sensitive adhesive layers on its opposite surfaces. Two rolled pressure sensitive adhesive layers 21a and 21b each having a separator are fed with their primer-coated surfaces being opposed to but out of contact with each other. Then, silicone blended with a filler is fed into the gap between the two pressure sensitive adhesive layers 21a and 21b. The pressure sensitive adhesive layers 21a and 21b between which silicone 22 is interposed are inserted between two rolls 23a and 23b which are spaced a predetermined distance apart from each other, and the pressure sensitive adhesive layers 21a and 21b are made to run in the opposite direction to the direction in which the material has been fed, whereby the pressure sensitive adhesive layers 21a and 21b between which silicone 22 is interposed is formed to a predetermined thickness. Then, the silicone 22 is heated through a heating zone and is adhered to the pressure sensitive adhesive layers 21a and 21b by bridge bonding, whereby the silicone 22 is integrated with the pressure sensitive adhesive layers 21a and 21b.

Figure 5:
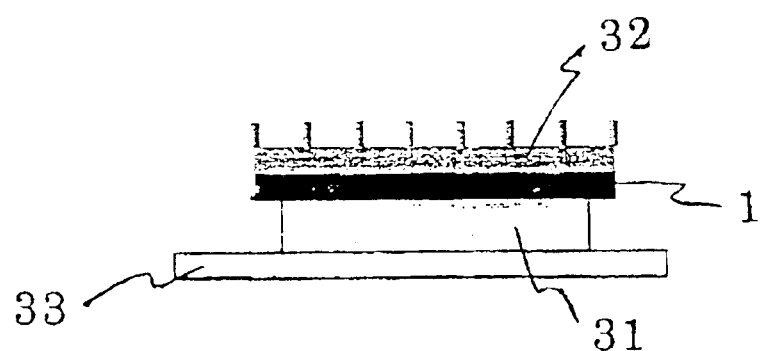
FIG. 5 is a view showing a construction in which a heat sink sheet according to the present invention is used with a CPU.

The heat sink sheet 1 fabricated in this step can be used in the state of being stuck to a heat source of electronic equipment. In use, as shown in FIG. 5 by way of example, the heat sink sheet 1 according to the present invention is stuck to the top of a CPU 31 and a heat sink 32 made of an aluminum plate is stacked on the heat sink sheet 1. In this manner, the CPU 31 and the heat sink 32 are secured to each other with using any other physical means therebetween, and in addition, it is possible to achieve highly efficient heat transfer from the CPU 31 to the heat sink 32.

Figure 6:
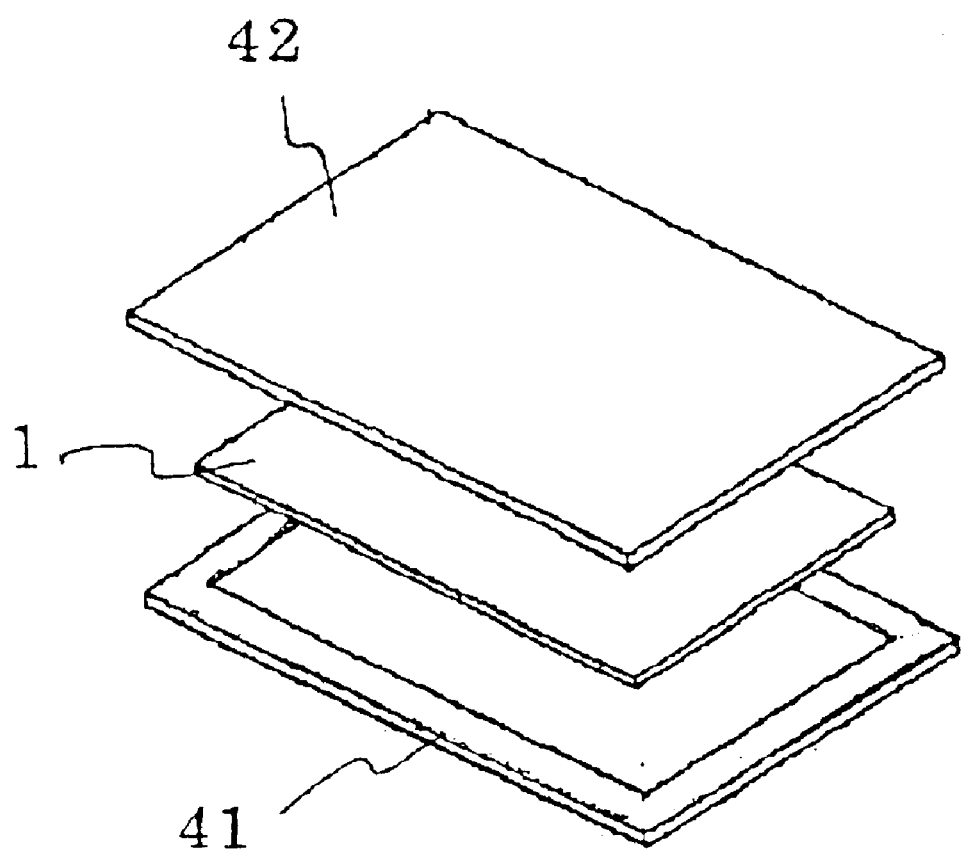
FIG. 6 is a view showing a construction in which a heat sink sheet according to the present invention is used in a plasma display panel.

FIG. 6 is a view showing an example in which a heat sink sheet having opposite surfaces respectively coated with acrylic-containing adhesive layers as pressure sensitive adhesive layers according to the present invention is used in a plasma display device. The heat sink sheet 1 is interposed between a plasma display panel (hereinafter referred to as PDP) 41 for displaying a picture and information and an aluminum plate 42 for dissipating heat generated from the PDP 41. The heat sink sheet 1 according to the present invention is soft and has adhesion, whereby the PDP 41 which is a heat source and the aluminum plate 42 can be satisfactorily secured with good adhesion. In addition, no air layer is formed at the interface between the heat sink sheet 1 and the PDP 41 nor between the heat sink sheet 1 and the aluminum plate 42, whereby nearly ideal adhesion can be realized between the PDP 41 and the heat sink sheet 1 and between the heat sink sheet 1 and the aluminum plate 42. Owing to this adhesion, the heat conduction between the PDP 41 and the heat sink sheet 1 and that between the heat sink sheet 1 and the aluminum plate 42 are increased, so that the efficiency of heat transfer from the PDP 41 to the aluminum plate 42 is increased. In addition, it is possible to reduce variations in the efficiency of heat transfer among different locations in the heat sink sheet 1. Incidentally, although not shown, the PDP 41 and the heat sink sheet 1 may also be secured by using a securing tool in addition to the pressure sensitive adhesive layer which constitutes the heat sink sheet 1 according to the present invention. Incidentally, the aluminum plate 42 corresponds to a heat sink sheet set forth in the appended claims.

EXAMPLES

Examples of the present invention will be described below, but the present invention is not to be construed as limited to any of the examples.

Example 1

A method of manufacturing a heat sink sheet using an acrylic-containing adhesive as its pressure sensitive adhesive layers will be described below.

(1) Composition of Acrylic-Containing Adhesive

| | |
|---|---|
| SK dyne 1717 GTL (manufactured by The Soken Chemical & Engineering Co., Ltd.) | 100 parts |
| Curing Agent L-45 (manufactured by The Soken Chemical & Engineering Co., Ltd.) | 1 part |
| Alumina #800 | 50 parts |

The above materials were blended and agitated.

(2) Fabrication of Film of Pressure Sensitive Adhesive

The acrylic-containing adhesive prepared in the above step (1) is uniformly applied by doctor coating to a 100-$\mu$m-thick PET film having opposite surfaces treated with a releasing agent. After the acrylic-containing adhesive was dried at 100° C. for 2 minutes after the application thereof, the film was wound up, whereby an 80-$\mu$m-thick pressure sensitive adhesive layer was formed.

(3) Application of Primer for Silicone

A primer for silicone ME 151 (manufactured by Toshiba Silicones) was uniformly applied by a brush to the surface coated with an adhesive compound in the above step (2).

(4) Composition of Heat Sink Silicone

| | |
|---|---|
| SH 1885 (manufactured by Toray Silicone) | 100 parts |
| KE 1950-40 | 20 parts |
| Alumina #800 | 300 parts |
| Silicon Carbide #320 | 100 parts |

The above materials were blended and agitated by an agitator.

(5) Supply of Silicone Compound and Integral Formation of Silicone Compound and Acrylic Pressure Sensitive Adhesive The PET film was fed from above while being wound off with the pressure sensitive adhesive layer coated with the silicone primer being faced down, and in addition, the PET film was fed from below while being wound off with a similar pressure sensitive adhesive layer being faced up. Two upper and lower rolls were spaced 1.2 mm apart, and the PET film coated with the pressure sensitive adhesive layer and fed from above was made to run around the upper roll, while the PET film coated with the pressure sensitive adhesive layer and fed from below was made to run around the lower roll, and the silicone compound having the above-described composition was fed to a position immediately before the rolls. After the thickness of silicone had been made uniform by passing the silicone compound through the gap between the rolls, silicone was cured by bridge bonding by being passed through a heat zone at 130° C. for 10 minutes, and was cut into plates of predetermined size.

(6) Evaluation of Fabricated Heat Sink Sheet

The PET films (released films) were removed from the work, and the following property values were obtained.

| Heat Conductivity | 1.47 W/m · K |
|---|---|
| Tensile Strength | 2.1 kg/cm$^2$ |
| Asker C Hardness | 38 |
| Shear Strength of Adhesion of Heat Sink Sheet to Aluminum | 2.4 kg/cm$^2$ (Material Destruction in Silicone Layer) |

Example 2

A method of manufacturing a heat sink sheet using an acrylic-containing adhesive as its pressure sensitive adhesive layers will be described below.

(1) Pressure Sensitive Adhesive Film

The pressure sensitive adhesive film used a rolled film in which a 50-μm-thick acrylic double face adhesive tape was formed on paper having opposite surfaces treated with a releasing agent (No. 5919, manufactured by Nitto Denko Corporation).

(2) Composition of Silicone Rubber

| SH 1885 (manufactured by Toray Silicone) | 100 parts |
|---|---|
| KE 1950-40 | 20 parts |
| Alumina #800 | 300 parts |
| Silicon Carbide #320 | 100 parts |
| KE 1800 C (manufactured by Shin-Etsu Chemical Co., Ltd.) | 1 part |

The above materials were blended and agitated by an agitator.

(3) Supply of Silicone Compound and Integral Formation of Silicone Compound and Acrylic Pressure Sensitive Adhesive The film was fed from below while being wound off with the pressure sensitive adhesive layer being faced up, and was coated with heat sink silicone by doctor coating. After the coating thickness had been made 1 mm, silicone was cured by heat, and was cut into plates of predetermined size.

(4) Evaluation of Fabricated Heat Sink Sheet

The released paper was removed from the work, and the following property values were obtained.

| Heat Conductivity | 1.55 W/m · K |
|---|---|
| Tensile Strength | 1.8 kg/cm$^2$ |
| Asker C Hardness | 33 |
| Shear Strength of Adhesion of Heat Sink Sheet to Aluminum | 2.0 kg/cm$^2$ (Material Destruction in Silicone Layer) |

Example 3

A method of manufacturing a heat sink sheet using an urethane-containing adhesive as its pressure sensitive adhesive layers will be described below.

(1) Composition of Urethane-Containing Adhesive

| High Plen P306 (manufactured by Mitsui Toatsu Chemicals, Inc.) | 38.3 parts |
|---|---|
| Polyole EP240 (manufactured by Mitsui Toatsu Chemicals, Inc.) | 62.7 parts |
| Lead Octylate | 0.3 part |

The above materials were blended and agitated by an agitator.

(2) Fabrication of Pressure Sensitive Adhesive Film

The urethane-containing adhesive was uniformly applied by doctor coating to a 100-μm-thick PET film having opposite surfaces treated with a releasing agent. After the urethane-containing adhesive was heated at 100° C. for 30 minutes after the application thereof, the film was wound up, whereby a 100-μm-thick pressure sensitive adhesive layer was formed.

(3) Composition and Application of Primer

| Silane Coupling Agent KBM 403 (manufactured by Shin-Etsu Chemical Co., Ltd.), Etsu Chemical Co., Ltd.), | 10 parts |
|---|---|
| Ethanol | 85 parts |
| H$_2$O | 5 parts |

The above compound was applied to the urethane-containing pressure sensitive adhesive surface by using a roll coater.

(4) Composition of Heat Sink Silicone

| SH 1885 (manufactured by Toray Silicone) | 100 parts |
|---|---|
| KE 1950-40 | 20 parts |
| Alumina #800 | 300 parts |
| Silicon Carbide #320 | 100 parts |

The above materials were blended and agitated by an agitator.

(5) Supply of Silicone Compound and Integral Formation of Silicone Compound and Urethane Pressure Sensitive Adhesive The PET film was fed from above while being wound off with the pressure sensitive adhesive layer coated with the silicone primer being faced down, and in addition, the PET film was fed from below while being wound off with a similar pressure sensitive adhesive layer being faced up. Two upper and lower rolls were spaced 1.2 mm apart, and the PET film coated with the pressure sensitive adhesive layer and fed from above was made to run around the upper roll, while the PET film coated with the pressure sensitive adhesive layer and fed from below was made to run around the lower roll, and the silicone compound having the above-described composition was fed to a position immediately before the rolls. After the thickness of silicone had been made uniform by passing the silicone compound through the gap between the rolls, silicone was cured by bridge bonding by being passed through a heat zone at 130° C. for 10 minutes, and was cut into plates of predetermined size.

(6) Evaluation of Fabricated Heat Sink Sheet

The PET films (released films) were removed from the work, and the following property values were obtained.

| | |
|---|---|
| Heat Conductivity | 1.31 W/m · K |
| Tensile Strength | 2.3 kg/cm² |
| Asker C Hardness | 33 |
| Shear Strength of Adhesion of Heat Sink Sheet to Aluminum | 2.6 kg/cm² (Material Destruction in Silicone Layer) |

In accordance with a first aspect of the present invention, it is possible to provide a heat sink sheet having high heat conductivity and the performance of a pressure sensitive adhesive by adhering a pressure sensitive adhesive layer to the whole or part of a surface of a heat sink layer. Heat sink sheets which have heretofore been known are acrylic-pressure-sensitive-adhesive-containing heat sink sheets and silicone heat sink sheets. The acrylic-pressure-sensitive-adhesive-containing heat sink sheets are low in heat conductivity and have a heat conductivity as low as approximately 0.5 W/m·K, but has an adherence close to pressure sensitive adhesive tape. On the other hand, the silicone heat sink sheets have a heat conductivity as low as approximately 1 W/m·K, but has no pressure sensitive adherence. As stated above in connection with each of the examples, as compared with such related art heat sink sheets, the heat sink sheet according to the present Invention has a high heat conductivity of 1 W/m·K or more equivalent to those of the silicone heat sink sheets, and also has the performance of a pressure sensitive adhesive. In addition, it is not necessary to physically secure a heat source and a heat sink by screws. By using such a heat sink sheet according to the present invention in the state of being interposed between a heat source of electronic equipment and a heat sink, it is possible to secure the heat sink and the heat source without the need for screwing or the like during the assembly of electronic equipment, and in addition, because the heat sink sheet according to the present invention is superior in heat conductivity, it is possible to design electronic equipment of excellent heat sink performance. Moreover, in the process of manufacturing the electronic equipment, it is possible to firmly secure the heat sink sheet of excellent heat conductivity to the heat source and the heat sink.

According to a second aspect of the present invention, the pressure sensitive adhesive layer according to the first aspect of the present invention is made of an acrylic-containing adhesive or an urethane-containing adhesive, whereby it is possible to fabricate a heat sink sheet having a strong adhesion performance.

According to a third aspect of the present invention, in the first or second aspect of the present invention, a heat sink filler is blended with the pressure sensitive adhesive layer, whereby it is possible to increase the heat conductivity of the adhesive material of low heat conductivity and it is also possible to increase the heat conductivity of the entire heat sink sheet.

According to fourth to seventh aspects of the present invention, a primer for adhesion to silicone is applied to an adhesion imparting agent is used, whereby it is possible to strongly adhere a silicone heat sink layer to the pressure sensitive adhesive layer.

According to eighth and ninth aspects of the present invention, it is possible to fabricate a heat sink sheet having softness and high adhesion performance.

According to tenth to fourteenth aspects of the present invention, the heat sink sheet according to the first to seventh aspects is intimately adhered to and interposed between a plasma display panel and a heat sink, whereby it is possible to secure the plasma display panel and the heat sink without using any other physical means.

What is claimed is:

1. A method for fabricating a heat sink sheet, comprising:

forming a pressure sensitive adhesive layer onto a surface treated with a releasing agent, the adhesive layer comprising a heat sink filler blended with an adhesive containing an acrylic or an urethane;

applying a silicone adherent primer onto the adhesive layer;

passing a liquid heat sink silicone between rolls to coat the primer-treated surface of the adhesive layer at a predetermined thickness; and applying heat to form a heat sink sheet by causing the silicone to adhere to the adhesive layer by bridge bonding.

2. A method for fabricating a heat sink sheet, comprising:

forming first and second pressure sensitive adhesive layers onto a respective surface treated with a releasing agent, each adhesive layer comprising a heat sink filler blended with an adhesive containing an acrylic or an urethane;

applying a silicone adherent primer onto each adhesive layer;

disposing the primer-treated surfaces of the adhesive layers opposite each other to form a volume therebetween;

disposing a liquid heat sink silicone in the volume between the adhesive layers to contact their primer-treated surfaces;

passing the adhesive layers and the silicone between rolls to form the silicone at a predetermined thickness; and applying heat to form a heat sink sheet by causing the silicone to adhere to the adhesive layers by bridge bonding.

3. A plasma display device, comprising:

a plasma display panel;

a heat sink plate; and a heat sink sheet formed by a method as in claim 2 interposed between the plasma display panel and the heat sink plate to adhere thereto with the adhesive layers.

* * * * *